United States Patent
Lee

(10) Patent No.: US 10,348,303 B2
(45) Date of Patent: Jul. 9, 2019

(54) DIFFERENTIAL LEVEL SHIFT CIRCUIT

(71) Applicant: FAIRCHILD SEMICONDUCTOR CORPORATION, Sunnyvale, CA (US)

(72) Inventor: Kyoung Min Lee, Mountain Top, PA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 15/652,471

(22) Filed: Jul. 18, 2017

(65) Prior Publication Data

US 2018/0062653 A1 Mar. 1, 2018

Related U.S. Application Data

(60) Provisional application No. 62/380,221, filed on Aug. 26, 2016.

(51) Int. Cl.
| | | |
|---|---|---|
| *H03L 5/00* | (2006.01) | |
| *H03K 19/003* | (2006.01) | |
| *H03K 5/24* | (2006.01) | |
| *H03K 19/0185* | (2006.01) | |

(52) U.S. Cl.
CPC ..... *H03K 19/00361* (2013.01); *H03K 5/2481* (2013.01); *H03K 19/018514* (2013.01)

(58) Field of Classification Search
CPC ..... H03K 19/00361; H03K 19/018514; H03K 5/2481

USPC ................................. 327/333; 326/80, 81
See application file for complete search history.

(56) References Cited

U.S. PATENT DOCUMENTS

| | | | | |
|---|---|---|---|---|
| 6,009,020 A | * | 12/1999 | Nagata | G11C 7/1006 365/189.05 |
| 6,389,063 B1 | * | 5/2002 | Kanekawa | H04L 1/0041 330/10 |
| 7,102,433 B2 | * | 9/2006 | Lee | H03F 3/3023 330/253 |
| 7,602,248 B2 | * | 10/2009 | Ishiguro | H03F 1/0261 330/255 |
| 2007/0223154 A1 | | 9/2007 | Locatelli et al. | |
| 2013/0328104 A1 | * | 12/2013 | Jonishi | H01L 29/7393 257/139 |
| 2015/0303797 A1 | * | 10/2015 | Akahane | H02M 1/32 323/311 |

FOREIGN PATENT DOCUMENTS

CN 101917811 B 4/2013

* cited by examiner

*Primary Examiner* — Ryan Jager
(74) *Attorney, Agent, or Firm* — Brake Hughes Bellermann LLP

(57) ABSTRACT

In a general aspect, a circuit can include a comparison stage including a plurality of transistors and a current mirror stage including a current mirror. The comparison stage can be configured to produce a cancelling signal before a main signal is produced by the current mirror stage.

20 Claims, 5 Drawing Sheets

DIFFERENTIAL LEVEL SHIFT CIRCUIT

TECHNICAL FIELD

This description relates to a differential level shift circuit.

BACKGROUND

A level shift circuit can be used in, for example, a high voltage integrated circuit (HVIC) application. However, known level shift circuits can have issues with glitches due to noise. Filtering circuity and/or a hysteresis buffer (e.g., Schmitt trigger) can be included in known level shift circuits to deal with glitch issues. These additional circuit elements can result in undesirable propagation delay.

SUMMARY

In a general aspect, a circuit can include a comparison stage including a plurality of transistors and a current mirror stage including a current mirror. The comparison stage can be configured to produce a cancelling signal before a main signal is produced by the current mirror stage.

DETAILED DESCRIPTION

Figure 1:
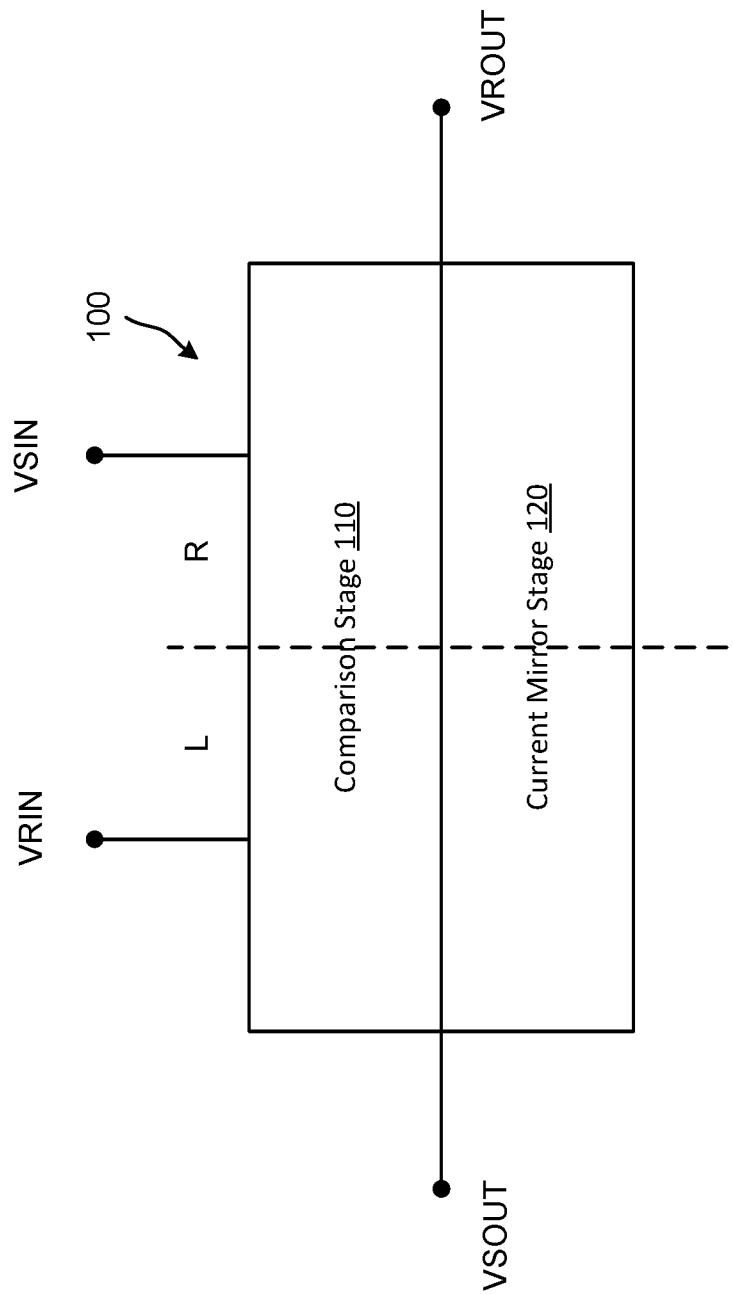
FIG. 1 is a block diagram that illustrates a level shift circuit.

FIG. 1 is a block diagram that illustrates a level shift circuit 100. In some implementations, the level shift circuit 100 can be referred to as a differential level shift circuit or as a noise cancellation circuit. In some implementations, the level shift circuit 100 can be included as part of a gate driver controlling a half bridge stage.

The level shift circuit 100 is a simpler and faster differential level shift circuit than known level shift circuits. The level shift circuit 100 can have a natural relatively high immunity to external dv/dt noise in a high voltage integrated circuit (HVIC).

As shown in FIG. 1, the level shift circuit 100 has inputs VRIN and VSIN (which can be separately referred to as a reset input and set input, respectively) into a comparison stage 110 and outputs VROUT and VS OUT (which can be separately referred to as a reset output and set output, respectively) between the comparison stage 110 and a current mirror stage 120. The voltages of the outputs VROUT and VS OUT are determined based on the current mirror stage 120 (e.g., transistor included in the current mirror stage 120). Specifically, the comparison stage 110 can provide a cancelling signal (e.g., first signal), which is produced first in time (e.g., first time), and transistors in the current mirror stage 120 can provide a main signal, which is produced later in time (e.g., second time) relative to the cancelling signal (e.g., second signal). In some implementations, the signals herein can be a current and/or a voltage.

The level shift circuit 100 can be quite fast in operation due to the sequence that a main signal at the current mirror stage 120 is after the cancelling signal at the comparison stage 110. Accordingly, glitches due to noise can be avoided. Filtering circuity and/or a hysteresis buffer (e.g., Schmitt trigger) (which may be included in known level shift circuits) can be eliminated. In some implementations of this circuit, the level shift circuit 100 can have two to three times reduced propagation delay compared with other level shift circuits including, for example, filters and/or hysteresis buffers. In some implementations, the switching speed of the level shift circuit 100 can be on the order of less than 10 nanoseconds (e.g., 8 ns, 7 ns).

In some implementations, the current generated by the comparison stage 110 can be referred to as a subtraction signal or as a cancelling signal. In some implementations, the signal generated by the current mirroring stage 120 can be referred to as an adding signal or as a main signal. In some implementations, the concepts of addition and subtraction can be used to cancel common-mode signals in differential comparison circuits.

The level shift circuit 100 can be robust against noise and can have a relatively high immunity against power up sequence issues and noise. Even without a filtering and hysteresis buffer, the level shift circuit 100 can exhibit little to no malfunctions even at a variety of process corners.

The level shift circuit 100 can have a smaller circuit size than known level shift circuits. The level shift circuit 100 can have a smaller number of gates to switch, and therefore can be lower power to operate than known level shift circuit solutions. Also, because the level shift circuit 100 is a relatively simple, small circuit, it can have fewer issues with process defects and variations.

Two different sides (side L and side R) of the level shift circuit 100 are illustrated with a vertical dashed line. As shown in FIG. 1, the set output VSOUT is on a same side of the level shift circuit 100 as the reset input VRIN. Also, as shown in FIG. 1, the reset output VROUT is on a same side of the level shift circuit 100 as the set input VSIN. This may be contrasted with other level shift circuits where a set input and output will be on the same side of the level shift circuit and where a reset input and output will be on the same side of the level shift circuit.

The operation of the level shift circuit 100 can be contrasted with circuits where a comparison stage can provide a main signal first and a current mirror stage can provide a cancelling signal later. In such implementations, as mentioned above, additional filters (e.g., R-C filters), transistors, and/or circuity (e.g., hysteretic comparators) may be needed to settle glitches. In the level shift circuit 100, a comparison of the cancelling signal and the main signal is provided as an output of the level shift circuit 100 without glitch handling (e.g., without a glitch handling circuit). Also, in such implementations, the main signal can be produced at a relatively slow rate because of the additional filters, transistors, and/or circuitry.

Figure 2:
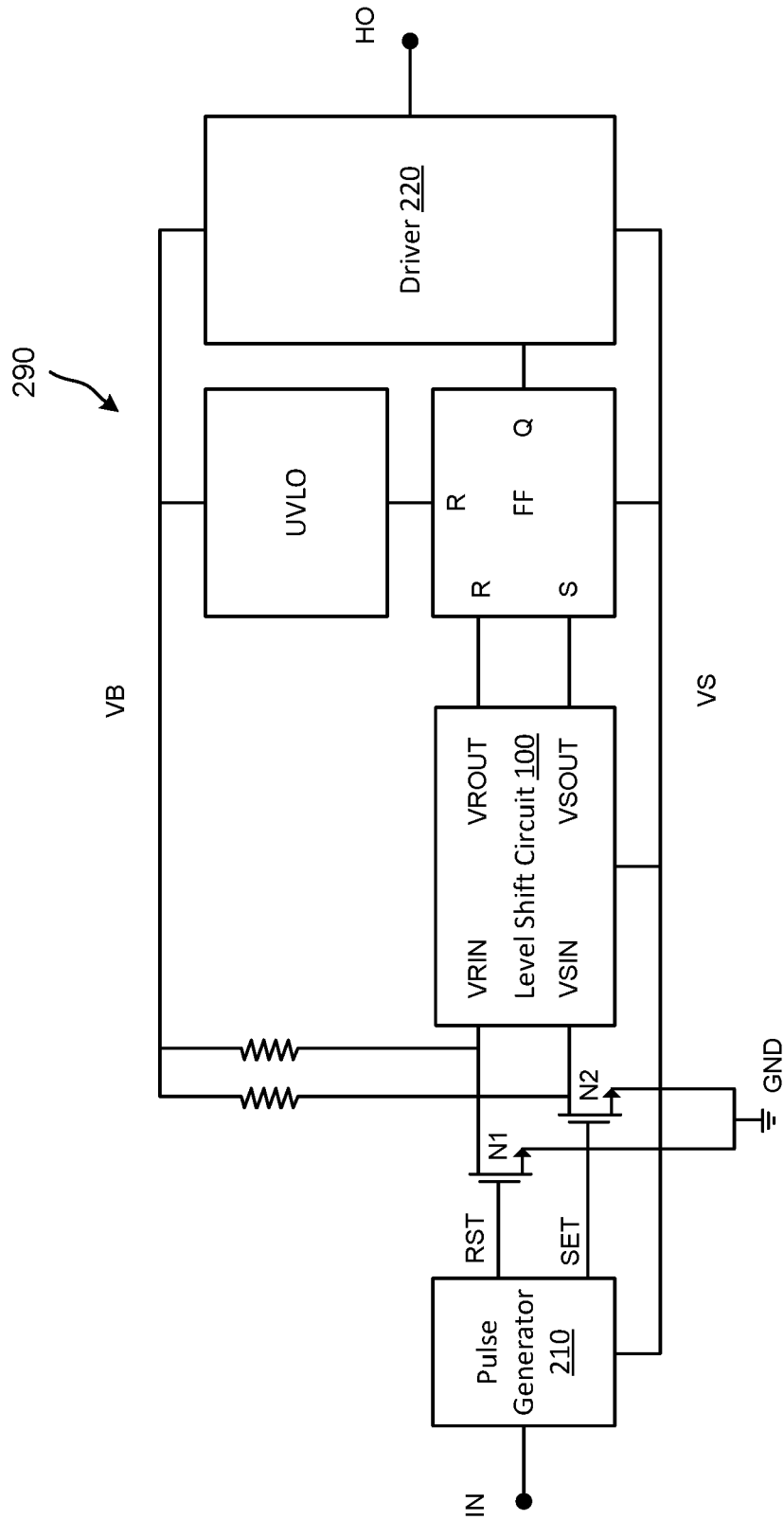
FIG. 2 is a block diagram that illustrates the level shift circuit coupled with other components.

The level shift circuit 100 can be used in a variety of applications. One such circuit 290 is illustrated in FIG. 2, which is a block diagram that illustrates the level shift circuit 100 coupled with other components associated with an output driver. As shown in FIG. 2, the circuit 290 is coupled to a high-side supply VB and a high-side supply return VS (or ground (e.g., GND, low-side supply return)). Although not shown, a low-side supply VDD can also be used in connection with the circuit 290.

As shown in FIG. 2, the level shift circuit 100 receives outputs RST and SET from a pulse generator 210 at inputs VRIN and VSIN via N-type MOSFETs (e.g., high voltage laterally diffused MOSFET (LDMOS)) N1 and N2. The outputs VROUT and VSOUT of the level shift circuit 100 can be coupled, respectively, to a reset input R and a set input S of a flip-flop FF. The flip-flop FF can be coupled to an under-voltage lock-out circuit (UVLO) and a driver 220. The driver 220 can be configured to produce a high output HO.

Figure 3:
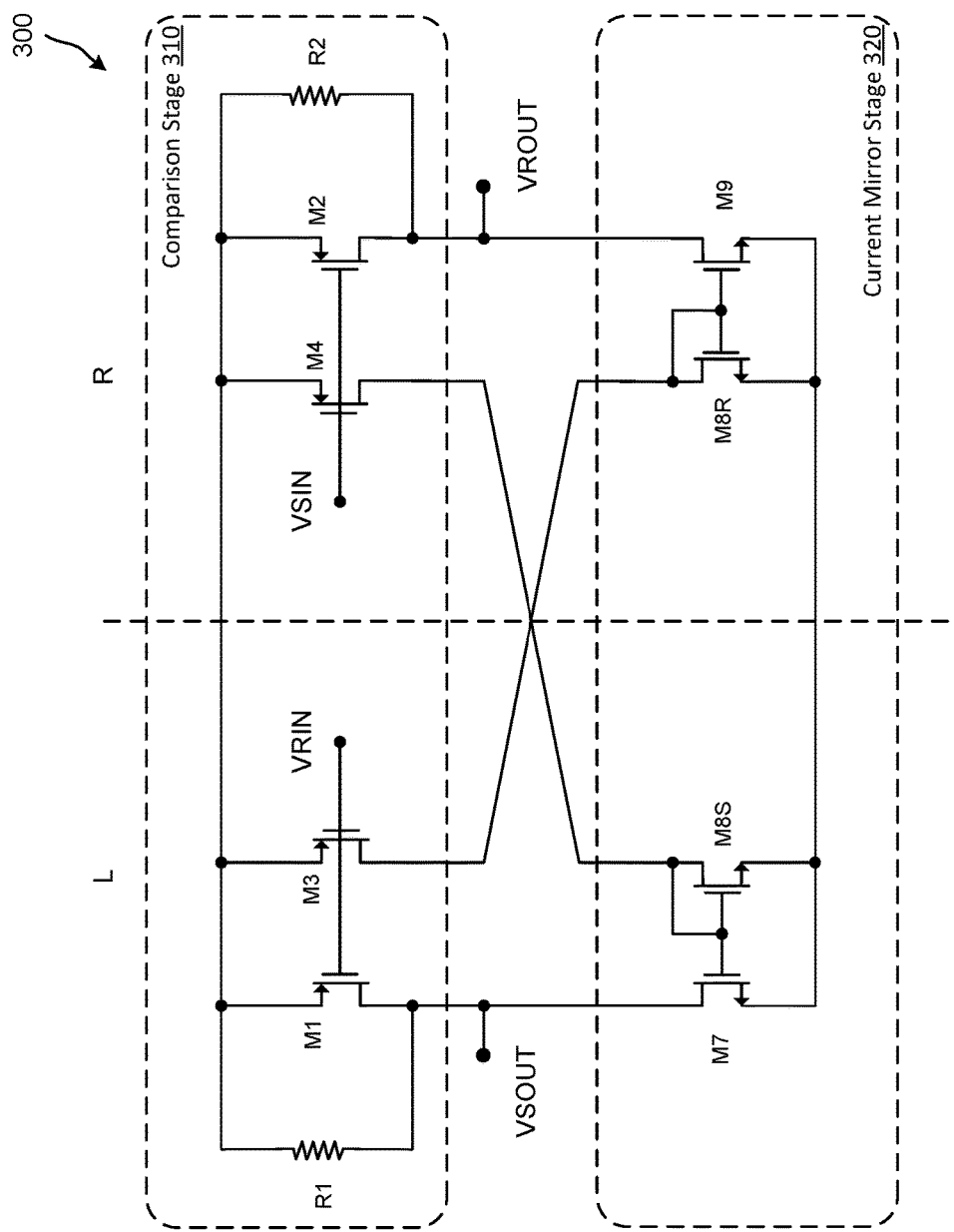
FIG. 3 is a diagram that illustrates an example of elements included in a level shift circuit.

FIG. 3 is a diagram that illustrates an example of elements (e.g., transistors, resistors, etc.) included in a level shift circuit 300 (e.g., level shift circuit 100). In this implementation, the level shift circuit 300 includes P-type (or P-channel) transistors M1 through M4 in a comparison stage 310 and N-type (or N-channel) transistors M7 through M9 in a current mirror stage 320. The comparison stage 310 includes (e.g., can only include) transistors of a first conductivity type and the current mirror stage includes (e.g., can only include) transistors of a second conductivity type opposite the first conductivity type. The transistors can be referred to as transistors with their labels (e.g., transistor M1) or simply by their labels (e.g., M1). In some implementations, the P-type can be referred to as a first conductivity type and the N-type can be referred to as a second conductivity type opposite the first conductivity type. In some implementations, the N-type can be referred to as a first conductivity type and the P-type can be referred to as a second conductivity type opposite the first conductivity type.

As shown in FIG. 3, the reset input VRIN is coupled to the gates of P-type transistors M1 and M3 (on side L of the level shift circuit 300) and the set input VSIN is coupled to the gates of P-type transistors M2 and M4 (on side R of the level shift circuit 300). The N-type transistor M7 is arranged in a current mirror configuration with N-type transistor M8S in the current mirror stage 320 (on side L of the level shift circuit 300). The N-type transistor M9 is arranged in a current mirror configuration with N-type transistor M8R in the current mirror stage 320 (on side R of the level shift circuit 300). In some implementation, a single transistor can be used to replace the separate transistors M8S and M8R. M7 can be included in a first current mirror (on side L) and M9 can be included in a second current mirror (on side R).

As shown in FIG. 3, the drain of P-type transistor M1 is coupled to the drain of N-type transistor M7. The set output VSOUT is coupled to the drains of transistors M1 and M7. The drain of transistor M8R, which is on side R, is coupled to the drain of transistor M3, which is on side L.

As shown in FIG. 3, the drain of P-type transistor M2 is coupled to the drain of N-type transistor M9. The reset output VROUT is coupled to the drains of transistors M2 and M9. The drain of transistor M8S, which is on side L, is coupled to the drain of transistor M4, which is on side R. The sources of transistors M1 through M4 are coupled to a high-side supply voltage (VB) or rail voltage (not shown) and the sources of transistors M7 through M9 are coupled to a high-side supply return voltage (VS) or rail voltage (not shown).

As shown in FIG. 3, the set output VSOUT is on a same side of the level shift circuit 300 as the reset input VRIN. Specifically, both VRIN and VSOUT are coupled to nodes (i.e., gate and drain respectively) of P-type transistor M1 in the comparison stage 310. The reset output VROUT is on a same side of the level shift circuit 300 as the set input VSIN. Specifically, both VSIN and VROUT are coupled to nodes (i.e., gate and drain respectively) of P-type transistor M2 in the comparison stage 310. As noted above, this may be contrasted with other level shift circuits where a set input and output will be on the same side of the level shift circuit and where a reset input and output will be on the same side of the level shift circuit.

As shown in FIG. 3, a resistor R1 is coupled between the source and drain of transistor M1. A resistor R2, similarly, is coupled between the source and drain of transistor M2. In some implementations, R1 and R2 can function as pull-up resistors. In cases where there is no input to input VRIN or input VSIN, R1 and R2 will cause the outputs VSOUT and VROUT to remain at the high-side supply voltage level.

In some implementations, two or more of transistors M1 through M4 can be the same size. In some implementations, two or more of transistors M7 through M9 can be the same size. In some implementations, M7 and/or M9 can be smaller than M8S and/or M8R. The transistor sizes can be used to improve immunity to mismatches in transistors and/or inputs between side L and side R.

In some implementations, transistors M1 and M2 in the comparison stage 310 are each larger in size (e.g., gate width size, physical size) than each of the transistors M3 and M4 in the comparison stage 310. In some implementations, each of the transistors M1 and M2 in the comparison stage 310 is 1.2 times larger in size (e.g., gate width size, physical size) than each of the transistors M3 and M4 in the comparison stage 310. In some implementations, one or more of the transistors M1 and M2 are less than 1.2 times larger or greater than 1.2 times larger in size (e.g., gate width size) than one or more of the transistors M3 and M4. In some implementations, the differences in sizes can be implemented to be robust against processing (e.g., manufacturing) variation between side L and side R. In some implementations, transistors M1 and M2 in the comparison stage 310 are each larger in size than the transistors M3 and M4, respectively, in the comparison stage 310, and transistors M7 and M9 are the same size as transistors M8S and M8R, respectively. In some implementations, transistors M1 and M2 in the comparison stage 310 are larger (e.g., significantly larger) than the transistors M3 and M4, respectively, in the comparison stage 310, and transistors M7 and M9 are larger (e.g., slightly larger) than transistors M8S and M8R, respectively. In some implementations, transistors M1 and M2 in the comparison stage 310 are the same size as the transistors M3 and M4, respectively, in the comparison stage 310, and transistors M7 and M9 are smaller than transistors M8S and M8R, respectively. In some implementations, the sizing of the transistors can be defined such that the cancelling signal (produced by transistors M1/M2) is larger (e.g., larger in magnitude) than the main signal (produced transistors M7/M9) so that, the cancelling signal cancels out the main signal in cases where the input VRIN and the input VSIN are the same level (e.g., magnitude).

In some implementations, transistor M1 and transistor M2 can be larger (e.g., approximately 1.2 times in size) than each of transistor M3 and transistor M4, and M7 through M9 can be the same size. The sizes of the transistors can be adjusted (e.g., defined at 1.1×, defined at 1.3×) to achieve different desirable results. These sizes noted above may be contrasted with other level shift circuits. In some implementations, the transistors of the level shift circuit 300 can be sized so that the comparison stage 310 will generate a signal that is large enough to cancel/subtract the main signal generated by the current mirror stage 320. This sizing can be particularly important in a scenario where the signals on the inputs VRIN and VSIN are the same (e.g., same value or level).

As noted above, the level shift circuit 300 is configured to control the signaling that is handled between the comparison stage 310 and the current mirror stage 320 to produce the outputs VSOUT and VROUT. The signaling from the drains of M2/M9 and M1/M7 is flipped relative to known level shift circuits. This results, as mentioned above, in the outputs VSOUT and VROUT being swapped (between side L and side R) due to the flipped configuration. The signals at the drains of M1 and M2 (and/or outputs VSOUT and VROUT) are at a high value when VRIN and VSIN are a high value at least one can be moved to a low value when VRIN or VSIN is at a low value.

As another example, when a signal at the gate of M1 is a low value (e.g., VRIN) (and the signal at the gate of M2 is higher than the signal at the gate of M1), the signal at the drain of M1 is a high value (e.g., VSOUT) and the signal at the drain of M2 is a low value (e.g., VROUT). When a signal at the gate of M2 is a low value (e.g., VSIN) (and the signal at the gate of M1 is higher than the signal at the gate of M2), the signal at the drain of M2 is a high value (e.g., VROUT) and the signal at the drain of M1 is a low value (e.g., VSOUT). When a signal at the gates of M1 and M2 are a low value (e.g., VRIN, VSIN) the signals at the drains of M1 and M2 are a high value (e.g., VROUT, VSOUT).

Although FIGS. 1 through 3 illustrate a circuit that has voltage inputs VRIN and VSIN, in some implementations, the circuits can be modified to handle comparisons of current as well. Even in such implementations, the comparison stage 310 can provide a cancelling signal (which is produced first in time (e.g., first time, first signal)) and transistors in the current mirror stage 320 can provide a main signal (which is produced later in time (e.g., second time) relative to the cancelling signal (e.g., second signal)).

FIGS. 4A through 4F illustrate operation of the circuit shown in FIG. 3. FIGS. 4A through 4F illustrate high values (represented by H) and low values (represented by L) on an x-axis and time (increasing to the right) on the y-axis. The graphs can be representative of circuit behavior and some timings, thresholds, and/or so forth can vary depending on circuit elements.

Figure 4A:
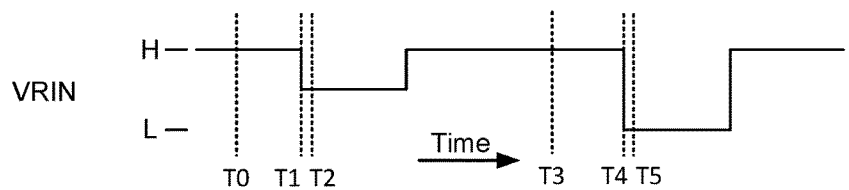
FIGS. 4A through 4F illustrate operation of the circuit shown in FIG. 3.
Figure 4B:
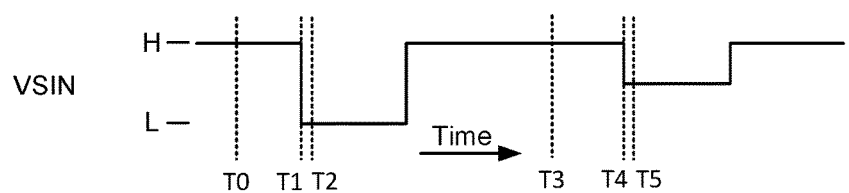

As shown in FIGS. 4A and 4B, at time T0, both VRIN and VSIN are at a high value. This will result in all of M1 through M4 (not shown) to be in an off-state. Accordingly, at time T0, the voltages at the gates of M7 and M9 (shown as M7_G and M9_G, respectively, in FIGS. 4C and 4D) are at a low value (with M7 through M9 being in an off-state). At time T0, both VSOUT and VROUT, in FIGS. 4E and 4F respectively, are at a high value (via resistors R1 and R2).

Figure 4C:
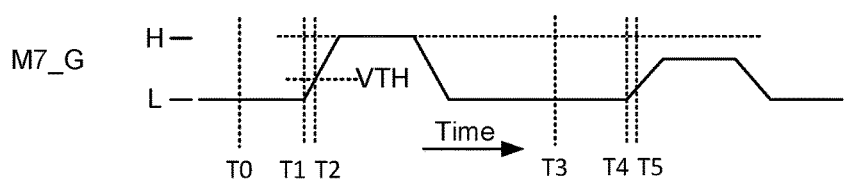
Figure 4D:
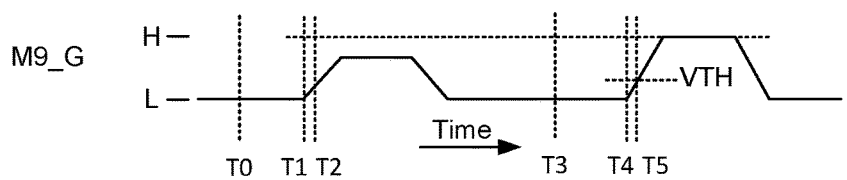
Figure 4E:
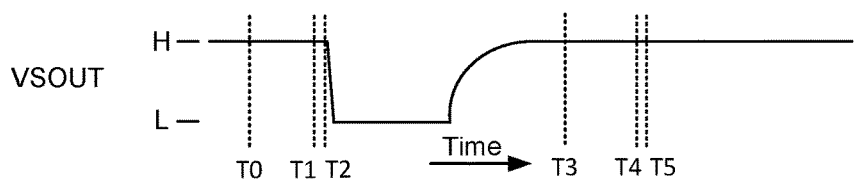
Figure 4F:
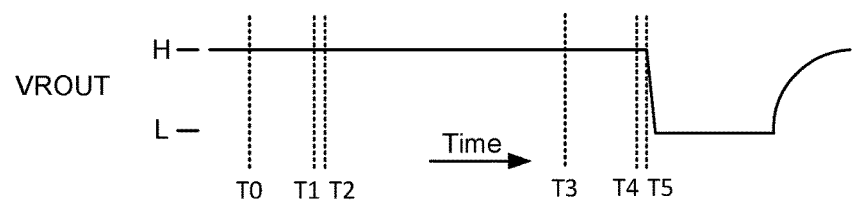

As shown in FIGS. 4A and 4B, at time T1, VSIN is changed to a low value and VRIN is moved from the high value to a lower value (e.g., a medium value, but not the low value). This will result in M2 and M4 being changed to an on-state, and M1 and M3 may be changed to at least a partially on-state. Accordingly, starting at time T1 as shown in FIG. 4C, the voltage at the gate of M7 will rise until M7 is changed to an on-state at approximately time T2. This will cause VSOUT as shown in FIG. 4E to be pulled down to the low value. The gate of M9 as shown in FIG. 4D rises starting at time T1, but M9 does not pull down VROUT as shown in FIG. 4F because M2 (which is fully on and is larger (e.g., 1.2× larger) than M9) is maintaining VROUT at a high value.

As mentioned above, the transistor sizes can be used to improve immunity against noise and mismatches in inputs between side L and side R. As a non-limiting example, in some implementations, the current of transistor M1 is larger (e.g., 1.2 times larger) than the current of transistor M3 due to differences in transistor sizes. In order for VSOUT to switch from a high value to a low value, transistor M7 is set to flow even larger current than transistor M1 can provide. To do this, transistor M4 can generate more current (e.g., 1.2 times more current) compared to transistor M3 which requires input VSIN to go lower than input VRIN. Input VSIN is lower than input VRIN by a difference in voltage that can allow transistor M4 to generate more current (e.g., 1.2 times more current) compared to that of transistor M3. If this difference in input voltages (difference between VSIN and VRIN) is larger than possible input level mismatches generated by other circuits or noise, it can operate properly.

As mentioned above, the transistor sizes can be used to improve immunity to mismatches in transistors (e.g., threshold voltage mismatches, circuit mismatches). As a non-limiting example, transistor M1 can be larger in physical size compared to transistor M3, so transistor M1 can handle larger current than that of transistor M3. If the inputs VRIN and VSIN are the same voltage (e.g., exactly the same voltage) and side L and side R are matching (e.g., perfectly matching), transistor M1 and transistor M2 can flow more current (e.g., 1.2 times more current) than transistor M7 and transistor M9 can allow. Outputs VSOUT and VROUT will remain high which can be a desirable result. Even if there is mismatch (e.g., 1.2 times mismatch) between side L and side R, both outputs VSOUT and VROUT will still remain high as desired.

As described, the signals from M1 through M4, which are in the comparison stage 310, are produced before signals are produced by M7 through M9, which are in the current mirror stage 320. As shown, the delay between M1 through M4 changing state and the output of VSOUT changing is relatively fast and is approximately based on the time for the gate of M7 to rise starting at time T1 to reach a threshold voltage (and on-state) at time T2.

At time T3 (in this configuration), both VRIN and VSIN are changed to a high value and the state of the circuit is returned to the same state as at time T0.

As shown in FIGS. 4A and 4B, at time T4, VRIN is changed to a low value and VSIN is moved from the high value to a lower value (e.g., a medium value, but not the low value). This will result in M1 and M3 being changed to an on-state, and M2 and M4 may be changed to at least a partially on-state. Accordingly, starting at time T4 as shown in FIG. 4D, the voltage at the gate of M9 will rise until M9 is changed to an on-state at approximately time T5. This will cause VROUT as shown in FIG. 4F to be pulled down to the low value. The gate of M7 as shown in FIG. 4C rises starting at time T4, but M7 does not pull down VSOUT as shown in FIG. 4E because M1 (which is fully on and is larger (e.g., 1.2× larger) than M7) is maintaining VSOUT at a high value.

As described, the signals from M1 through M4, which are in the comparison stage 310, are produced before signals are produced by M7 through M9, which are in the current mirror stage 320. As shown, the delay between M1 through M4 changing state and the output of VROUT changing is relatively fast and is approximately based on the time for the gate of M9 to rise starting at time T4 to reach a threshold voltage (and on-state) at time T5.

Said differently, the states of M1 through M4 are immediately (or relatively quickly) changed in response to changes in state of VRIN and VSIN, respectively. Accordingly, the signals produced by M1 through M4 are produced, respectively, at VSOUT and VROUT before signals from M7 through M9. This is because the gate voltages of M7 through M9 take time to charge up and are slower to produce a signal at VSOUT and/or VROUT than M1 through M4.

The level shift circuit 300 is configured so that the signal that changes the state on the output (VSOUT or VROUT) of the comparison stage 310 will arrive later than the signal that sustains the comparison state to the same state. For example, when switching at time T1, M7 changes the state of VS OUT to a low value and this signal arrives later than signals produced by the transistors in comparison stage 310. Transistor M2 (which has a signal that comes first), which is included in the comparison stage 310 and is larger than transistor M9 (which has a signal that comes later), maintains VROUT at the same state.

In known level shift circuits, there may be glitches in the drains of transistors in a current mirror stage that are not present in the level shift circuit 300. In addition, the rise in the drains of transistor in a current mirror stage may be delayed by filter circuits (RC filter circuits) that are included in known level shift circuits. In some known level shift circuits that include Schmitt trigger circuits, switching speeds may also be further delayed. These delays will result in output voltages that are much slower than the time between time T1 and time T2 to produces the output voltages of VSOUT and VROUT as shown in FIGS. 4A through 4F.

Figure 5:
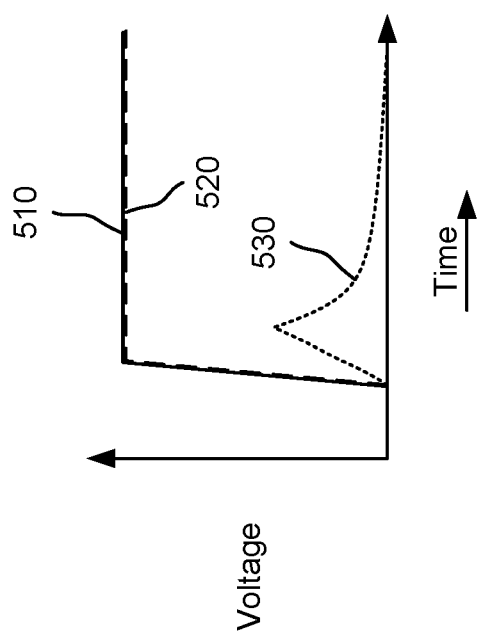
FIG. 5 is a graph that illustrates operation of the level shift circuits described herein.

FIG. 5 is a graph that illustrates operation of the level shift circuits described herein (e.g., level shift circuit 100, level shift circuit 300). Voltage is illustrated on a y-axis and time is illustrated on an x-axis. The graph includes a curve 510 that represents a high side supply voltage minus a low side supply voltage (e.g., VB−GND, VB−VS), and a curve 520 that represents voltage at a drain of transistor(s) in a current mirror stage (e.g., transistor M2 shown in FIG. 3 and a voltage at a drain of transistor M9 shown in FIG. 3). As shown in FIG. 5, the voltage of curve 520 (e.g., voltage of drain of transistor M2 and the drain of transistor M9) follows the high side supply voltage of curve 510. This is contrasted with known level shift circuits where such rises as illustrated by curve 510 would result in a glitch at drains of transistors in a current mirror stage as illustrated by curve 530.

In this specific application associated with FIG. 5, there two power supplies and two supply returns (VB: High-side supply, VS: High-side supply return, VDD: Low-side supply, GND: Low-side supply return). The role of the IC (e.g., HVIC) associated with FIG. 5 can be, for example, to transform a signal that switches in the low side region to a signal that switches in the high side. During operation of the IC, VB and VS can instantly increase so fast in reference to GND while maintaining the voltage difference between VB and VS—this is when VB−GND dv/dt issues can occur. During a power up sequence, VB can instantly build in reference to VS—this is when VB−VS dv/dt issues can occur.

Figure 6:
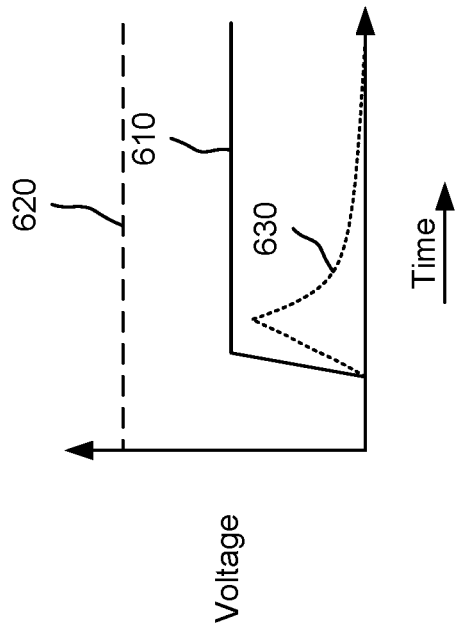
FIG. 6 is another graph that illustrates operation of the level shift circuits described herein.

FIG. 6 is another graph that illustrates operation of the level shift circuits described herein (e.g., level shift circuit 100, level shift circuit 300). Voltage is illustrated on a y-axis and time is illustrated on an x-axis. The graph includes a curve 610 that represents a common-mode signal (or voltage), and a curve 620 that represents voltage at a drain of transistor(s) in a current mirror stage (e.g., transistor M2 shown in FIG. 3 and a voltage at a drain of transistor M9 shown in FIG. 3). As shown in FIG. 6, the voltage of curve 620 (e.g., voltage of drain of transistor M2 and the drain of transistor M9) is stable despite changes in the common-mode signal of curve 610. This is contrasted with known level shift circuits where such rises as illustrated by curve 610 would result in a glitch at drains of transistors in a current mirror stage as illustrated by curve 630.

In one general aspect, a circuit can include a comparison stage including a plurality of transistors, and a current mirror stage including a current mirror. The comparison stage can be configured to produce a cancelling signal before a main signal is produced by the current mirror stage.

In some implementations, the comparison stage includes a first transistor that is changed to at least a partially on-state and produces the cancelling signal at an output in response to an input signal. The cancelling signal can be produced before a second transistor, which is also coupled to the output, in the current mirror stage is turned to an on-state. In some implementations, the comparison stage includes a first transistor that is changed to at least a partially on-state and produces the cancelling signal at an output in response to an input signal. The cancelling signal can prevent the main signal from being produced at the output.

In some implementations, the circuit can also include a reset input coupled to a transistor included in the comparison stage, and a set output is coupled to the transistor. In some implementations, the circuit can also include a reset input coupled to a gate of a transistor included in the comparison stage, and a set output is coupled to a drain of the transistor.

In some implementations, the comparison stage includes a first transistor and a second transistor. The first transistor and the second transistor can each include a gate coupled to an input. The first transistor being can be to an output and can be larger than the second transistor. In some implementations, the cancelling signal has a larger magnitude than a magnitude of the main signal so that the cancelling signal cancels out the main signal when a set input and a reset input into the comparison stage are the same.

In some implementations, the comparison stage includes transistors of a first conductivity type and the current mirror stage includes transistors of a second conductivity type opposite the first conductivity type. In some implementations, a comparison of the cancelling signal and the main signal is provided as an output without a glitch handling circuit.

In another general aspect, a circuit can include a comparison stage including a first transistor of a first conductivity type and a second transistor of the first conductivity type. The first transistor of the first conductivity type can be coupled to a reset input and a set output, and the second transistor of the first conductivity type can be coupled to a set input and a reset output. The circuit can include a current mirror stage including a first transistor of a second conductivity type in a current mirror configuration with a second transistor of the second conductivity type.

In some implementations, the comparison stage is configured to provide a cancelling signal before a main signal is produced by the current mirror stage. In some implementations, the first conductivity type is a P-type conductivity, the second conductivity type is a N-type conductivity. In some implementations, the set output is a low value when the set input is at the low value. In some implementations, the set output is the low value in response to the set input being at the low value while the reset input is at a value higher than the low value. In some implementations, the set output changes to a low value in response to the set input changing to the low value and the reset input changing to a value higher than the low value.

In yet another general aspect, a circuit can include a comparison stage including a first transistor of a first conductivity type and a second transistor of the first conductivity type. The circuit can include a current mirror stage including a first transistor of a second conductivity type in a first current mirror on a first side of the circuit, and a second transistor of the second conductivity type included in a second current mirror on a second side of the circuit. The first transistor of the first conductivity type can be on the first side of the circuit and can be coupled to second current mirror. The second transistor of the first conductivity type can be on the second side of the circuit and is coupled to first current mirror.

In some implementations, the first current mirror is coupled to a first output and the second current mirror is coupled to a second output. The circuit can also include a third transistor of the first conductivity type included in the first side of the circuit and coupled to the first output, and a fourth transistor of the first conductivity type included in the second side of the circuit and coupled to the second output.

In some implementations, the first transistor of the first conductivity type and the third transistor of the first conductivity type each have a gate coupled to an input. In some implementations, the first transistor of the first conductivity type is coupled to a reset input and a set output. The second transistor of the first conductivity type can be coupled to a set input and a reset output. In some implementations, a comparison of a cancelling signal produced by the comparison stage and a main signal produced by the current mirror stage is provided as an output of the circuit. In some implementations, the circuit is included in a gate driver controlling a half bridge stage.

It will also be understood that when an element, such as a transistor or resistor, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application (if included) may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes an industrial motor driver, a solar inverter, ballast, a general-purpose half-bridge topology, an auxiliary and/or traction motor inverter driver, a switching mode power supply, an on-board charger, an uninterruptible power supply (UPS), a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some implementations may be implemented using various types of semiconductor processing techniques associated with semiconductor substrates including, but not limited to, for example, Silicon (Si), Galium Arsenide (GaAs), Galium Nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A circuit, comprising:
   a comparison stage including a first transistor of a first conductivity type and a second transistor of the first conductivity type,
   the first transistor of the first conductivity type being coupled to a reset input and a set output,
   the second transistor of the first conductivity type being coupled to the reset input, the second transistor of the first conductivity type having a gate coupled to a gate of the first transistor of the first conductivity type at the reset input, the first transistor of the first conductivity type having a size larger than a size of the second transistor of the first conductivity type; and
   a current mirror stage coupled to the comparison stage and including a first transistor of a second conductivity type in a current mirror configuration with a second transistor of the second conductivity type, the second transistor of the second conductivity type having a drain coupled to a drain of the first transistor of the first conductivity type at a set output.

2. The circuit of claim 1, wherein the comparison stage is configured to provide a cancelling signal before a main signal is produced by the current mirror stage.

3. The circuit of claim 1, wherein the first conductivity type is a P-type conductivity, the second conductivity type is a N-type conductivity.

4. The circuit of claim 1, wherein the set output is a low value when a set input into the comparison stage is at the low value.

5. The circuit of claim 4, wherein the set output is the low value in response to the set input being at the low value while the reset input is at a value higher than the low value.

6. The circuit of claim 1, wherein the set output changes to a low value in response to a set input applied to the comparison stage changing to the low value and the reset input changing to a value higher than the low value.

7. The circuit of claim 1, wherein the circuit is configured to output a comparison of a cancelling signal produced by the comparison stage and a main signal produced by the current mirror stage.

8. A circuit, comprising:
a comparison stage including a first transistor, a second transistor, and a third transistor, the first transistor in the comparison stage having a gate coupled to a gate of the third transistor in the comparison stage at a reset input, the second transistor in the comparison stage having a gate coupled to a set input; and
a current mirror stage including;
a first transistor of a second conductivity type in a first current mirror on a first side of the circuit, and
a second transistor of the second conductivity type included in a second current mirror on a second side of the circuit,
the first transistor in the first current mirror having a source coupled to a source of the second transistor of the second current mirror,
the first transistor in the comparison stage being on the first side of the circuit and being coupled to the first current mirror at a set output, the third transistor in the comparison stage being coupled to the second current mirror, the second transistor of the first conductivity type being on the second side of the circuit and being coupled to second current mirror at a reset output,
the circuit producing a comparison of a cancelling signal produced by the comparison stage and a main signal produced by the current mirror stage as an output,
the comparison stage and the current mirror stage being configured such that the set output has a high value when the set input and the reset input are both the high value.

9. The circuit of claim 8, wherein the comparison stage further includes:
a fourth transistor in the second side of the circuit and coupled to the reset output.

10. The circuit of claim 8, wherein the circuit is included in a gate driver controlling a half bridge stage.

11. The circuit of claim 8, wherein the third transistor included in the comparison stage is larger than the first transistor included in the comparison stage.

12. The circuit of claim 8, wherein the cancelling signal has a larger magnitude than a magnitude of the main signal so that the cancelling signal cancels out the main signal when the set input and the reset input applied to the comparison stage are the same.

13. The circuit of claim 8, wherein a comparison of the cancelling signal and the main signal is provided without a glitch handling circuit.

14. A circuit, comprising:
a comparison stage including a plurality of transistors, the plurality of transistors including:
a first transistor of a first conductivity type on a first side of the circuit configured to produce a cancelling signal at a set output at a drain of the first transistor of the first conductivity type in response to a reset input signal received at a reset input at a gate of the transistor of the first conductivity type and at a gate of a second transistor of the first conductivity type,
the first transistor of the first conductivity type being larger than the second transistor of the first conductivity type,
a third transistor of the first conductivity type and a fourth transistor of the first conductivity type each having a gate coupled to a set input on a second side of the circuit; and
a current mirror stage including a first transistor of a second conductivity type included in a current mirror configuration with a second transistor of the second conductivity type on the first side of the circuit, the first transistor of the second conductivity type having a drain coupled to the set output at the drain of the first transistor of the first conductivity type,
the comparison stage configured to produce the cancelling signal before a main signal is produced by the current mirror stage at the set output,
the comparison stage and the current mirror stage being configured such that the set output has a high value when the set input and the reset input are both the high value.

15. The circuit of claim 14, wherein the first transistor of the first conductivity type is configured to change to at least a partially on-state when producing the cancelling signal at the set output in response to the reset input signal, and
the cancelling signal is produced before the second transistor of the second conductivity type in the current mirror stage is turned to an on-state.

16. The circuit of claim 14, wherein the first transistor of the first conductivity type is configured to change to at least a partially on-state when producing the cancelling signal at the set output in response to the reset input signal, and
the cancelling signal prevents the main signal from being produced at the set output.

17. The circuit of claim 14, wherein the cancelling signal has a larger magnitude than a magnitude of the main signal so that the cancelling signal cancels out the main signal when the set input and the reset input applied to the comparison stage are the same.

18. The circuit of claim 14, wherein the first conductivity type is opposite the second conductivity type.

19. The circuit of claim 14, wherein a comparison of the cancelling signal and the main signal is provided as the set output without a glitch handling circuit.

20. The circuit of claim 14, wherein the circuit is included in a gate driver controlling a half bridge stage.

* * * * *